United States Patent [19]
Heppler et al.

[11] Patent Number: 5,631,192
[45] Date of Patent: May 20, 1997

[54] SEMICONDUCTOR DEVICE ON AN OPPOSED LEADFRAME AND METHOD FOR MAKING

[75] Inventors: Richard E. Heppler, Mesa; Paul L. Sullivan, Phoenix, both of Ariz.

[73] Assignee: Motorola, Inc., Schaumburg, Ill.

[21] Appl. No.: 537,584

[22] Filed: Oct. 2, 1995

[51] Int. Cl.[6] .................................................. H01L 21/10
[52] U.S. Cl. ........................................ 438/25; 438/107
[58] Field of Search ............................. 437/209, 211, 437/214, 215, 217, 218, 219, 220; 257/666, 676

[56] References Cited

U.S. PATENT DOCUMENTS

| | | | |
|---|---|---|---|
| 3,839,782 | 10/1974 | Lincoln | 257/666 |
| 3,893,158 | 7/1975 | Lincoln | 257/666 |
| 4,047,045 | 9/1977 | Paxton, Jr. et al. | 250/551 |
| 4,160,308 | 7/1979 | Coutney et al. | 437/220 |
| 4,446,375 | 5/1984 | Aird | 250/551 |
| 4,633,582 | 1/1987 | Ching et al. | |
| 5,049,527 | 9/1991 | Merrick et al. | 437/220 |
| 5,198,391 | 3/1993 | Rösel et al. | 437/220 |
| 5,389,578 | 2/1995 | Hodson et al. | 437/209 |
| 5,491,111 | 2/1996 | Tai | 437/209 |

*Primary Examiner*—Kevin Picardat
*Attorney, Agent, or Firm*—Bruce T. Neel

[57] ABSTRACT

A semiconductor device (10) is formed from a single leadframe (11) by aligning two electronic components (22,24) relative to each other. The leadframe (11) has two bonding regions (30,31), which are offset from each other, and interconnect bars (13) which are used to align the two bonding regions (30,31). After the electronic components (22,24) are mounted to their respective bonding regions (30,31), the interconnect bars (13) are bent downward or upward relative to the plane formed by the leadframe (11). The bending of the interconnect bars (13) will move the two electronic components (22,24) towards each other in the direction essentially parallel to the plane of the leadframe (11). A transparent mold (28) is then formed to encapsulate the electronic components (22,24). A body (29) is then formed around the transparent mold (28) and leads (19,20). A trim and form operation releases the semiconductor device (10) from the leadframe (11).

25 Claims, 5 Drawing Sheets

SEMICONDUCTOR DEVICE ON AN OPPOSED LEADFRAME AND METHOD FOR MAKING

BACKGROUND OF THE INVENTION

The present invention relates, in general, to semiconductor devices, and more particularly, to semiconductor devices formed on an opposed leadframe.

Optoisolators are electronic components which transmit electrical information between a light source (emitter) and a light detector (receiver), without electrical connection. The light emitted can be either invisible such as infrared or can be emitted in the visible spectrum. An enabling input signal to the optoisolator causes the light source to turn on. The light detector then senses the light from the emitter source and produces a corresponding output signal. As a result, the output signal is coupled to the input signal optically rather than with an electrical connection. Consequently such devices are called optoisolators. In some electrical circuit applications, a high voltage circuit and a low voltage circuit must interact in order to process data. To electrically isolate the two circuits from noise or cross talk, optoisolators are used.

In order for an optoisolator to operate properly, the light source and light detector must be oriented properly with respect to each other. If too little light from the emitter reaches the detector, then the sensitivity of the detector suffers. If too much light reaches the detector, then the speed performance suffers because saturation of the phototransistor on the detector will reduce the switching speed of the detector. If the spacing between the emitter and the detector is too great, light transfer efficiency will be decreased and if the distance is too short, the isolation voltage of the optoisolator is degraded.

To accurately control the placement of the emitter component relative to the detector component, previously known methods for assembling optoisolators have placed the two electronic components on separately formed lead frames and then molding them together while maintaining the proper alignment and spacing. In an effort to reduce the cost of a two leadframe system, other techniques place both components on the same leadframe and then encapsulate both components in a transparent mold which is covered with a reflective shield. Even more complicated methods attach the two components on the same leadframe, but prior to encapsulating the devices, a portion of the leadframe containing one device is bent 180° such that the two devices are folded on top of each other. All of these techniques either require additional material cost or introduce complexity into the assembly process which in turn will increase the final cost of the optoisolator. Due to the malleability of the rotated leadframe, this method can have variation in the final placement of the two devices. This will degrade the performance of the optoisolator.

Accordingly, it would be advantageous to have a method for forming a semiconductor device such as an optoisolator from a single leadframe. It would be of further advantage if the method did not require the formation of a reflective coating layer and could provide a method that could accurately control and repeat the spacing between the electronic elements of the semiconductor device.

DETAILED DESCRIPTION OF THE DRAWINGS

Figure 1:
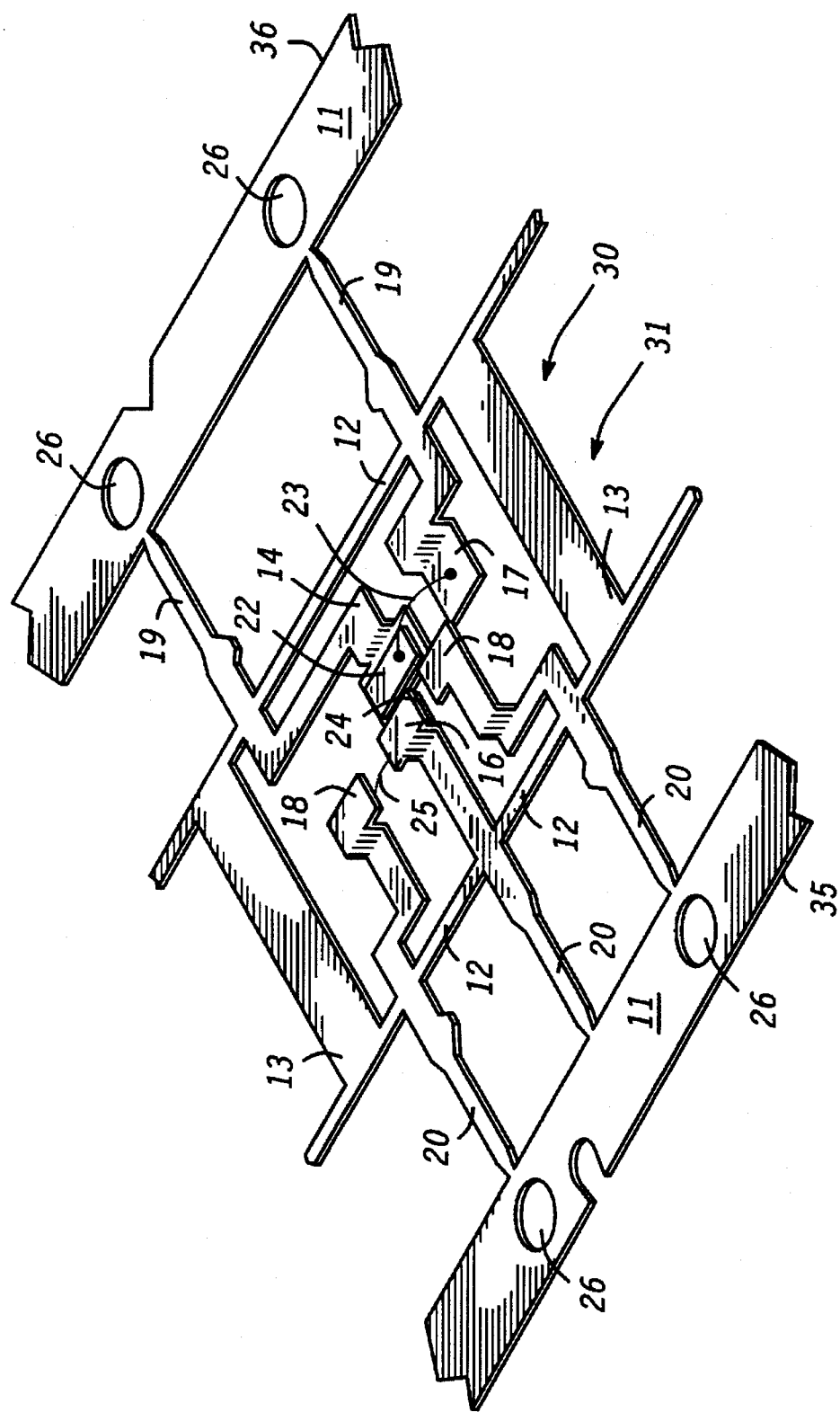
FIGS. 1–2 are enlarged isometric views of a semiconductor device at various stages of fabrication.

FIG. 1 is an enlarged isometric view of a semiconductor device 10 in an early stage of fabrication. In the present invention, semiconductor device 10 is described as an optocoupler or an optoisolator which has two electronic components 22 and 24 formed on an opposed leadframe 11. The first electronic component 22 is a light emitting diode referred to as an emitter and the second electronic component 24 is a light detector or receiver. In some applications, it is necessary to electrically isolate portions of a circuit from each other, but still allow input and output signals to be communicated between the two circuits. This is necessary to prevent cross talk, noise, or high current levels from damaging the circuits. This can be prevented by optically coupling the circuits together.

When completed, optoisolator 10 uses first electronic component 22 to enable second electronic component 24 by generating a light signal. Light generated by emitter 22 passes through a transparent medium which is in turn detected by receiver 24. It will also be understood that the present invention can also be used to form a semiconductor device having two electronic components which may be magnetically coupled together rather than optically. In an effort to reduce the size and the number of components in an electrical circuit, it is also possible to form a semiconductor device where the two electronic devices are not coupled together, but rather simply reside in close proximity to each other. Optoisolator 10 is formed from a single leadframe 11 having holes 26 which are used by tooling equipment to maneuver and align leadframe 11 through various assembly operations. Leadframe 11 also has dambars 12 and interconnect bars 13 which are used to provide structural support and form optoisolator 10 during the assembly process. Leadframe 11 can be divided into two bonding regions 30 and 31, one each for the mounting of electronic components 22 and 24 respectively. The first bonding region 30 has a die flag 14 and a bonding lead 17 both of which are electrically connected to a lead 19. The second bonding region 31 has a die flag 16 with bonding leads 18 which are electrically connected to by leads 20.

To fabricate optoisolator 10 as shown in FIG. 1, leadframe 11 is patterned by either a stamping or an etch process using a starting material made from copper, copper alloy, or the like. If desired, die flags 14 and 16 and bonding leads 17 and 20 can be electroplated by masking off portions of leadframe 11 and then covering the desired area with a material such as gold, nickel, or copper. The first and second bonding regions 30 and 31 are then bent to be offset or opposed relative to each other. In a forming operation, die flag 14 and bonding lead 17 is bent downward relative to the plane formed by leadframe 11 and die flag 16 and bonding leads 20 are bent up. It is not necessary that both bonding regions 30 and 31 be offset from the plane of the leadframe, in fact it is possible to bend only one of the bonding regions 30 and 31 such that one is higher than the other.

After bonding regions 30 and 31 are offset relative to each other, electronic component 22 is aligned and bonded to die flag 14 with either a solder pre-form, eutectic bond, or any adhesive and conductive material. A bonding wire 23 is then formed from electronic component 22 to bonding lead 17. As a result, the anode and cathode of emitter 22 are each connected to different leads 19. Leadframe 11 is then flipped so that electronic component 24 can be bonded to die flag 16 again with either a solder pre-form, eutectic bond, or any adhesive and conductive material. If electronic component 24 is a light detector, a collector terminal is bonded to die flag 16 and then bonding wires 25 are formed between a base and an emitter terminal of electronic component 24 and bonding leads 18. Note that in the above mentioned embodiment, electronic components 22 and 24 are bonded such that they are facing each other. This is necessary for the next operation where electronic components 22 and 24 are aligned opposed to each other. To show how leadframe 11 is manipulated to align electronic components 22 and 24, FIG. 1 is labeled with edges 35 and 36.

Figure 2:
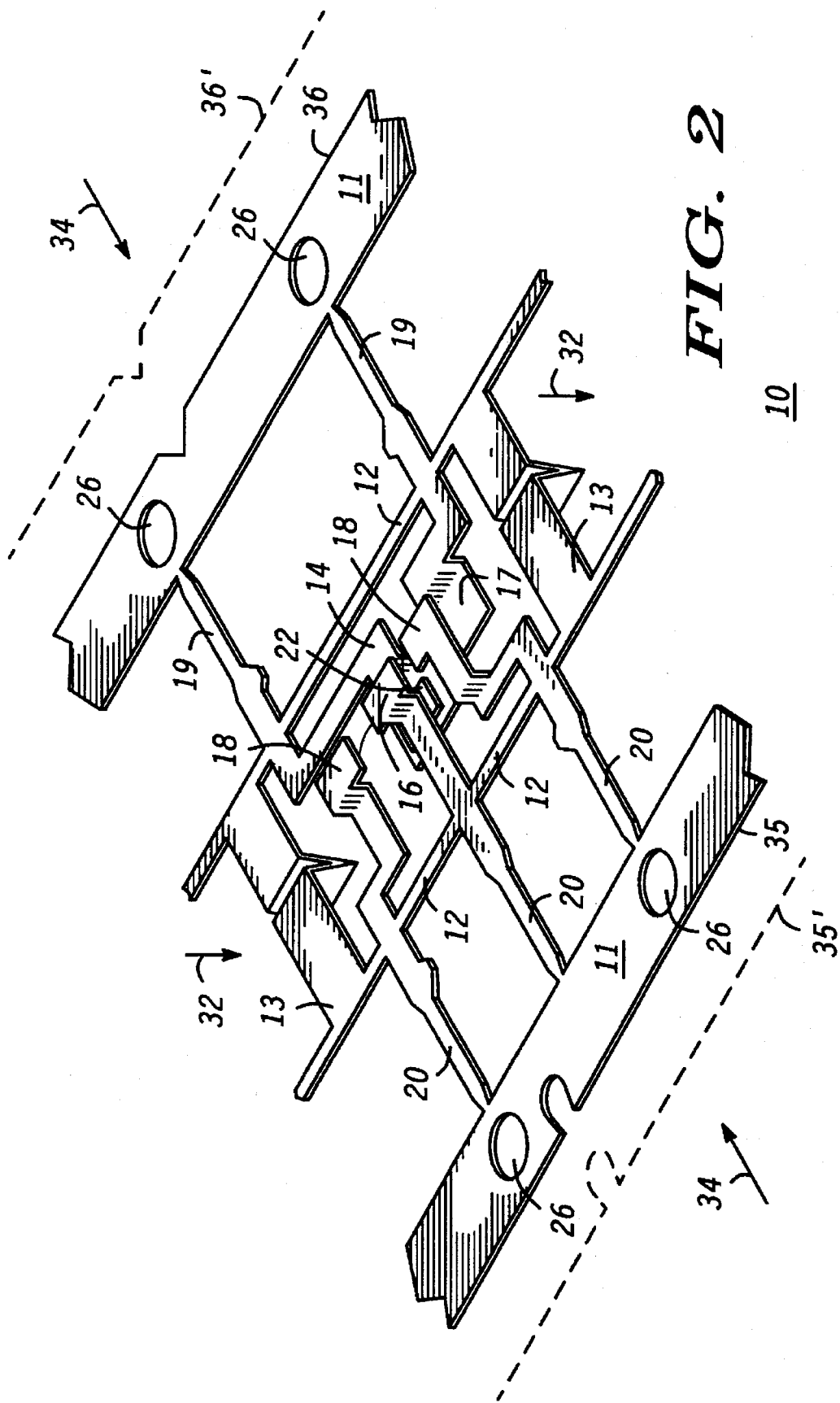
Figure 3:
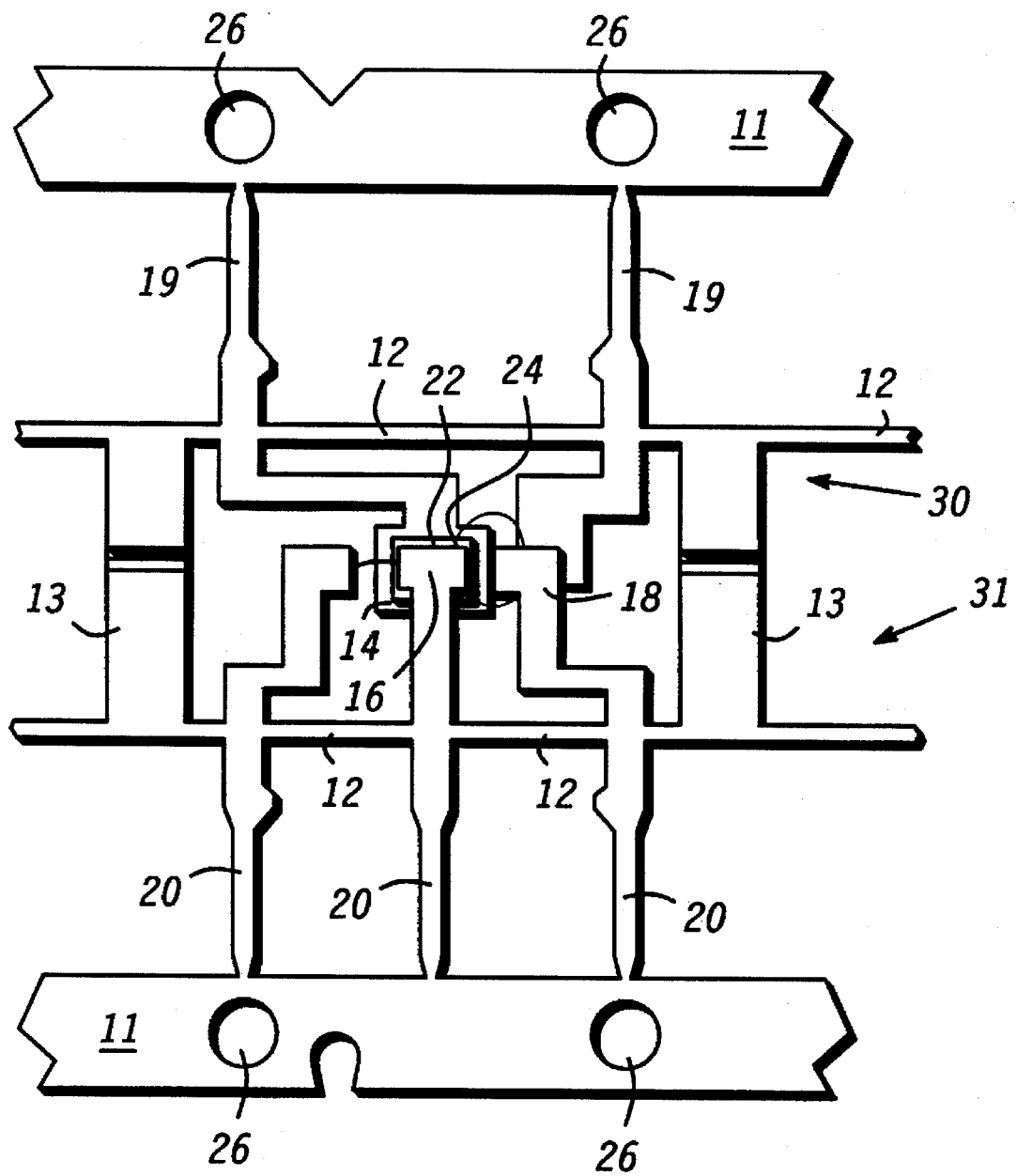
FIGS. 3–5 are enlarged top views of a semiconductor device at various stages of fabrication and FIG. 6 is an enlarged cross-sectional view of a completed semiconductor device along the lines 6—6 of FIG. 5.

FIG. 2 is an enlarged isometric view of semiconductor device 10 after further processing. In a forming operation, electronic component 24 is brought over electronic component 22 by bending, crimping, or coining interconnect bars 13. As long as leadframe 11 is free to move, bending interconnect bars 13 downward as shown by arrows 32 or upward, will cause first and second bonding regions 30 and 31, and all of their elements, to move or slide towards each other in the direction indicated by arrows 34. Note, the position of edges 35 and 36 of leadframe 11 prior to the bending operation is labeled as 35' and 36'. Since first and second bonding regions 30 and 31 have been previously offset relative to each other, it is possible to form leadframe 11 such that electronic component 24 of second bonding region 31 is positioned directly over electronic component 22 of first bonding region 30 as shown in FIG. 3. The space between electronic components 22 and 24 is determined by the thickness of each component and the amount of offset between first bonding region 30 and second bonding region 31.

During the above mentioned forming operation, force is applied directly to interconnect bars 13 and no pressure or stress was applied to die flags 14 and 16 or to bonding leads 17 and 18. Therefore there is minimal risk of damaging electronic components 22 and 24 or bonding wires 23 and 25. By adjusting the downward or upward distance interconnect bars 13 are formed, and by controlling the final shape of interconnect bars 13, the final alignment of electronic components 22 and 24 relative to each other can be accurately controlled and readily reproduced. During the following mold operations, interconnect bars 13 can be left on leadframe 11 to maintain the placement of electronic components 22 and 24.

Figure 4:
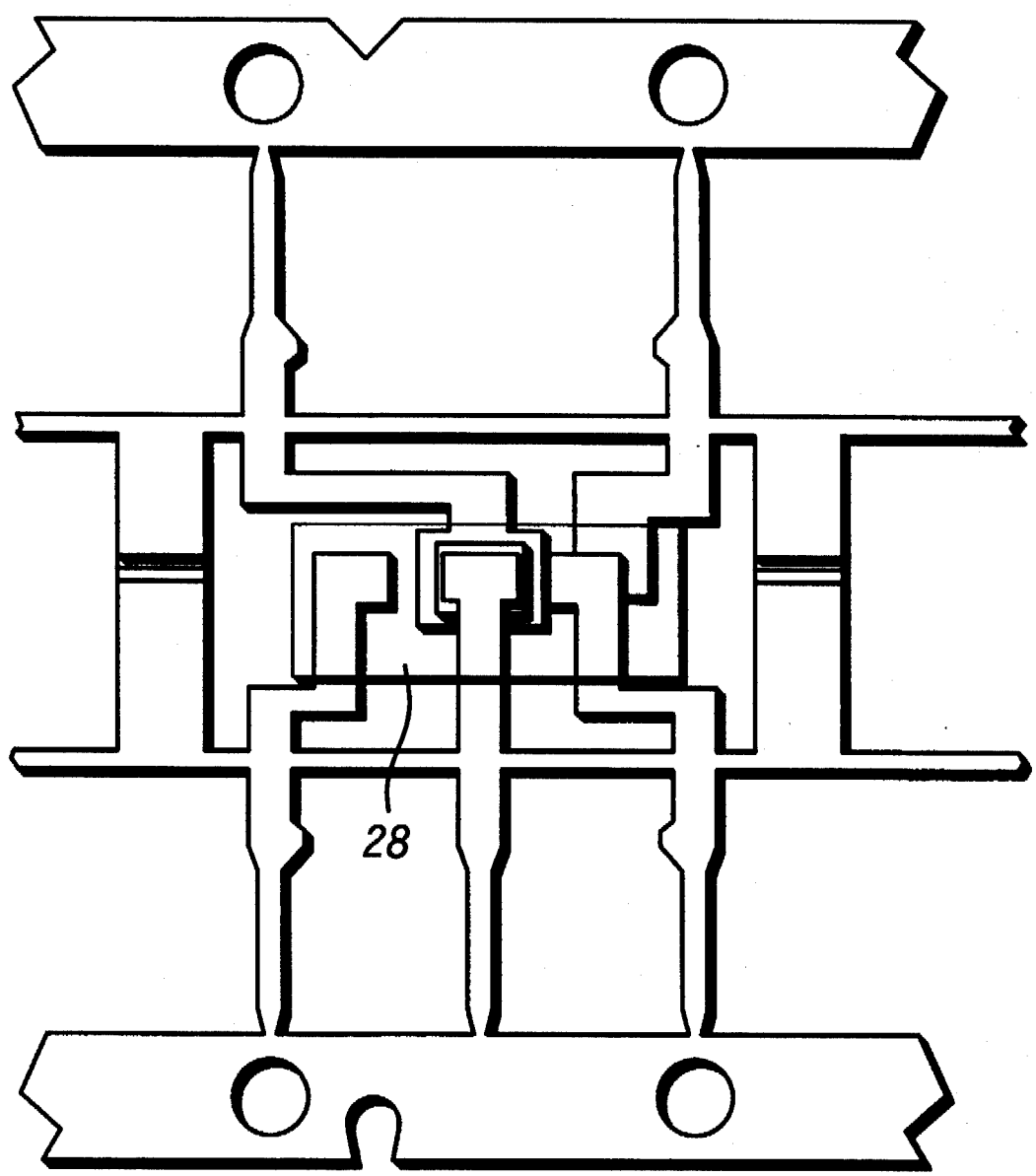
Figure 5:
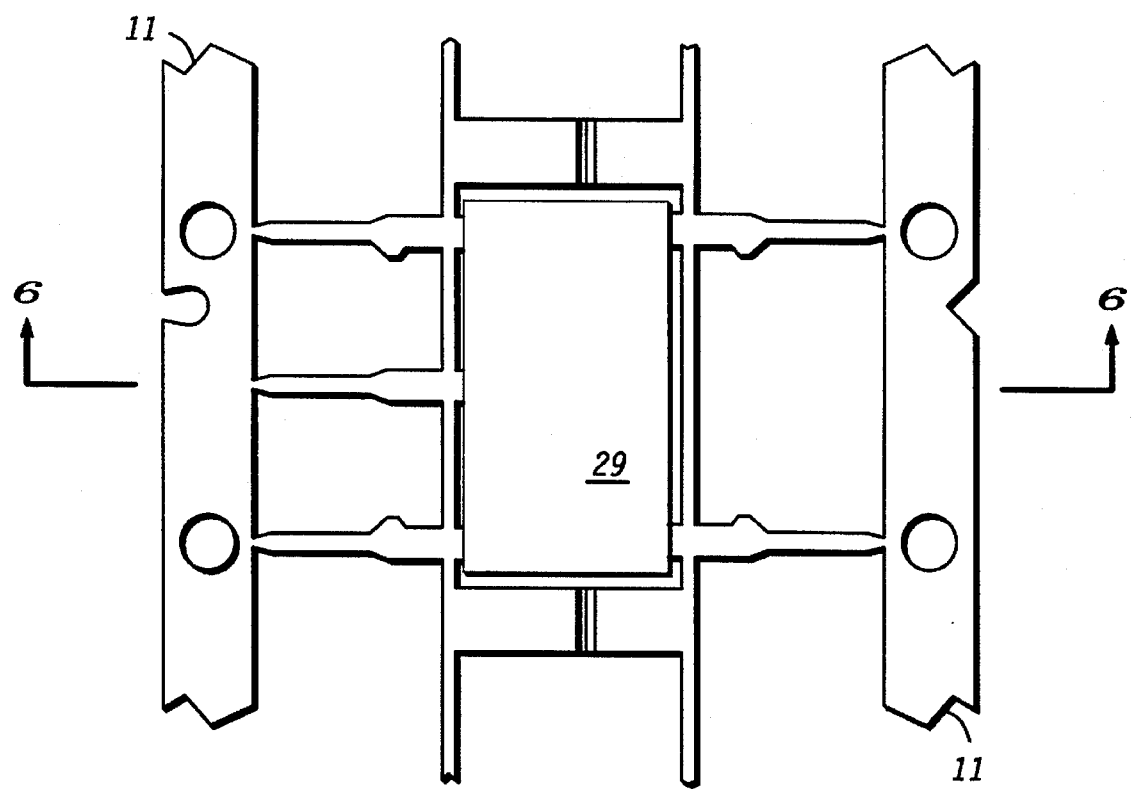

FIG. 4 is an enlarged top view of semiconductor device 10 after further processing. An optically transparent mold compound 28 is formed on leadframe 11 to encapsulate electronic components 22 and 24. Transparent mold 28 can be formed from any material that is transparent to the frequency of light that is generated by emitter 22 such as thermal set epoxy. Since light emitter 22 is formed directly over light detector 24, the need to form a reflective coating or dome over transparent mold 28 is obviated. In a second mold operation, a body 29 is formed around transparent mold 28 and a portion of leads 19 and 20 as shown in FIG. 5. Body 29 can be formed from any mold compound used in the industry and is formed to provide semiconductor device 10 with environmental and electrical protection.

Figure 6:
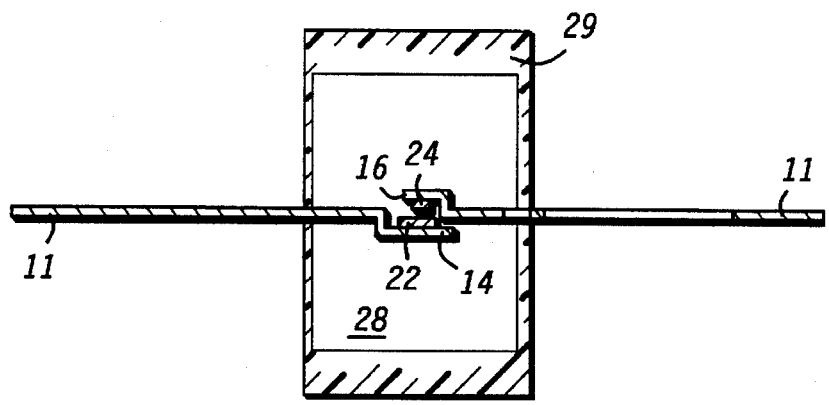

FIG. 6 is an enlarged cross-sectional view of completed semiconductor device 10 on leadframe 11. Note final placement of electronic components 22 and 24 are opposed to each other and are offset from the plane formed by leadframe 11. It will be understood that it is possible to form semiconductor device 10 such that either of the two electronic components 22 and 24 can be in a plane formed by leadframe 11. It will also be understood that if electronic components 22 and 24 are either magnetically coupled together or not coupled at all, it may not be necessary to align electronic components 22 and 24 directly over each other and it is not necessary to form transparent mold 28.

After the above mentioned molding operations, semiconductor device 10 is trimmed and formed from leadframe 11 by removing dambars 12 releasing leads 19 and 20 from leadframe 11. To simplify the trim and form operation, it may be necessary to remove interconnect bars 13. In the present invention the sequence of mounting electronic components 22 and 24 could be reversed. It is also possible to form a semiconductor device from two electronic components that have additional bonding leads which will require additional bonding wires.

By now it should be appreciated that the present invention provides a method for forming a semiconductor device 10, such as a optoisolator, on an opposed leadframe 11. During the forming operation to set electronic component 22 opposed to electronic component 24, there is no stress or force applied to bonding regions 30 and 31 which reduces the risk of damaging semiconductor device 10 during the assembly process. The forming of interconnect bars 13 to align electronic components 22 and 24 relative to each other is a repeatable process which can be accurately controlled and adjusted. The presence of interconnect bars 13 also improves the manufacturability of semiconductor device 10 by providing structural support to leadframe 11 during the molding operation. Since the present invention can be formed from a single stamped leadframe, the total material cost is reduced over some previously known methods that require two leadframes or the formation of a reflective coating or dome.

We claim:

1. A method for forming a semiconductor device on an opposed leadframe comprising the steps of:
    providing a leadframe having leads, a first die flag defining a first plane, and a second die flag defining a second plane substantially parallel to the first plane;
    mounting a first electronic component to the first die flag;
    mounting a second electronic component to the second die flag; and
    forming a portion of the leadframe such that at least one of the first and second electronic components are moved substantially within their respective planes to a position closer to one another.

2. The method for forming a semiconductor device on an opposed leadframe of claim 1 further comprising the step of forming an optically transparent mold compound between the first electronic component and the second electronic component.

3. The method for forming a semiconductor device on an opposed leadframe of claim 1 further comprising the step of forming a mold compound overlying a portion of the leads.

4. The method for forming a semiconductor device on an opposed leadframe of claim 1, wherein the first electronic component and the second electronic component form an optoisolator.

5. The method for forming a semiconductor device on an opposed leadframe of claim 1, wherein the first electronic component is a light emitter.

6. The method for forming a semiconductor device on an opposed leadframe of claim 1, wherein the second electronic component is a light detector.

7. The method for forming a semiconductor device on an opposed leadframe of claim 1, wherein the step of forming a portion of the leadframe further comprises bending an interconnect bar relative to a plane formed by the leadframe.

8. The method for forming a semiconductor device on an opposed leadframe of claim 1, wherein the step of forming an optically transparent mold compound further comprises forming a mold from thermal set epoxy.

9. A method for forming a semiconductor device comprising the steps of:

providing a leadframe having leads, a first die flag, and a second die flag;

forming the first die flag and the second die flag such that the first die flag is higher than the second die flag;

mounting a first electronic component to the first die flag;

mounting a second electronic component to the second die flag; and bending a portion of the leadframe such that the first electronic component moves over the second electronic component.

10. The method for forming a semiconductor device of claim 9 further comprising the step of forming an optically transparent mold compound between the first electronic component and the second electronic component.

11. The method for forming a semiconductor device of claim 9 further comprising the step of forming a mold compound overlying a portion of the leads.

12. The method for forming a semiconductor device on an opposed leadframe of claim 9, wherein the first electronic component and the second electronic component form an optoisolator.

13. The method for forming a semiconductor device on an opposed leadframe of claim 9, wherein the first electronic component is a light emitter.

14. The method for forming a semiconductor device on an opposed leadframe of claim 9, wherein the second electronic component is a light detector.

15. The method for forming a semiconductor device on an opposed leadframe of claim 9, wherein the step of forming the first die flag and the second die flag further comprises moving the first die flag above a plane formed by the leadframe and moving the second die flag below the plane formed by the leadframe.

16. The method for forming a semiconductor device on an opposed leadframe of claim 9, wherein the step of forming the first die flag and the second die flag further comprises moving the first die flag above a plane formed by the leadframe.

17. The method for forming a semiconductor device on an opposed leadframe of claim 9, wherein the step of forming a portion of the leadframe further comprises bending an interconnect bar relative to a plane formed by the leadframe.

18. The method for forming a semiconductor device on an opposed leadframe of claim 9, wherein the step of forming an optically transparent mold compound further comprises forming a mold from thermal set epoxy.

19. A method for forming a semiconductor device comprising the steps of:

providing a leadframe having an interconnect bar, a first bonding region, and a second bonding region, the first bonding region and the second bonding region each having a die flag and a plurality of leads;

forming the first bonding region and the second bonding region such that the first bonding region is offset from the second bonding region;

mounting a first electronic component to the die flag of the first bonding region;

mounting a second electronic component to the die flag of the second bonding region;

wire bonding the first electronic component to the plurality of leads of the first bonding region;

wire bonding the second electronic component to the plurality of leads of the second bonding region;

forming the interconnect bar such that the first electronic component slides over the second electronic component; and forming a mold compound overlying the first electronic component and the second electronic component.

20. The method for forming a semiconductor device of claim 19, wherein the first electronic component and the second electronic component form an optoisolator.

21. The method for forming a semiconductor device of claim 19, wherein the step of forming the interconnect bar further comprises bending an interconnect bar relative to a plane formed by the leadframe.

22. The method for forming a semiconductor device of claim 19, wherein the first electronic component is a light emitter.

23. The method for forming a semiconductor device of claim 19, wherein the second electronic component is a light detector.

24. The method for forming a semiconductor device of claim 19, wherein the step of forming the first bonding region and the second bonding region further comprises moving the first bonding region above a plane formed by the leadframe and moving the second bonding region below the plane formed by the leadframe.

25. The method for forming a semiconductor device of claim 19, wherein the step of forming the first bonding region and the second bonding region further comprises moving the first bonding region above a plane formed by the leadframe.

* * * * *